United States Patent
Van Schoot et al.

(10) Patent No.: US 7,889,321 B2
(45) Date of Patent: Feb. 15, 2011

(54) ILLUMINATION SYSTEM FOR ILLUMINATING A PATTERNING DEVICE AND METHOD FOR MANUFACTURING AN ILLUMINATION SYSTEM

(75) Inventors: Jan Bernard Plechelmus Van Schoot, Eindhoven (NL); Hendricus Johannes Maria Meijer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 222 days.

(21) Appl. No.: 11/730,751

(22) Filed: Apr. 3, 2007

(65) Prior Publication Data
US 2008/0246940 A1 Oct. 9, 2008

(51) Int. Cl.
*G03B 27/54* (2006.01)
*G03B 27/42* (2006.01)
(52) U.S. Cl. .......................................... 355/67; 355/53
(58) Field of Classification Search .................. 355/67, 355/53, 71; 250/548, 492.1
See application file for complete search history.

(56) References Cited

U.S. PATENT DOCUMENTS

| | | | |
|---|---|---|---|
| 5,963,306 A | 10/1999 | Tanitsu et al. ................. | 355/67 |
| 6,195,201 B1 | 2/2001 | Koch et al. ................... | 359/366 |
| 2002/0154282 A1 | 10/2002 | Mori | |
| 2004/0160586 A1 * | 8/2004 | Nishi ............................ | 355/53 |
| 2004/0227922 A1 * | 11/2004 | Dierichs et al. ............... | 355/71 |
| 2005/0225739 A1 * | 10/2005 | Hiura ............................ | 355/67 |
| 2006/0097202 A1 | 5/2006 | Singer et al. | |
| 2006/0119828 A1 | 6/2006 | Ito et al. | |
| 2007/0069160 A1 | 3/2007 | Banine et al. | |

FOREIGN PATENT DOCUMENTS

EP   0 848 298 A2   6/1998

OTHER PUBLICATIONS

International Preliminary Report on Patentability and Written Opinion of the International Searching Authority for International Application No. PCT/NL2008/050184 dated Oct. 15, 2009.
Search Report and Written Opinion as issued for Singapore Patent Application No. 200905946-0, dated Mar. 30, 2010.

* cited by examiner

*Primary Examiner*—Peter B Kim
(74) *Attorney, Agent, or Firm*—Pillsbury Winthrop Shaw Pittman LLP

(57) ABSTRACT

An illumination system includes a housing, and an optical system located within the housing. The optical system includes at least one optical element. The optical system is constructed and arranged to illuminate a patterning device with a radiation beam diverging from an intermediate focus. The intermediate focus is located at a position substantially at the same level or below a bottom portion of the illumination system.

24 Claims, 2 Drawing Sheets

ILLUMINATION SYSTEM FOR ILLUMINATING A PATTERNING DEVICE AND METHOD FOR MANUFACTURING AN ILLUMINATION SYSTEM

FIELD

The present invention relates to an illumination system for illuminating a patterning device, and a method for manufacturing an illumination system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Generally, electromagnetic radiation that emanates from a radiation source is focused by a collector to converge the radiation when entering an illumination system for illuminating the patterning device. The illumination system typically includes several optical elements, such as mirrors to illuminate the patterning device using the radiation beam conditioned by the illumination system.

In order to limit the amount of the radiation beam's illumination power that is lost due to reflections generated by the mirrors of the illumination system, it has been proposed to limit the number of mirrors present in the illumination system.

Limiting the amount of mirrors may decrease the ability to predetermine the direction from which the radiation beam emanating from the radiation source enters the illumination system.

For a significant number of possible designs of the illumination system, it is desirable to have the radiation beam be incident from below the illumination system. It has, therefore, been proposed to transmit the radiation beam through a floor supporting the illumination system, but the floor would need to be significantly modified in order for the radiation beam to be able to pass through the floor.

SUMMARY

According to an aspect of the present invention, there is provided an illumination system for illuminating a patterning device. The illumination system includes a housing, and an optical system located within the housing. The optical system includes at least one optical element. The optical system is constructed and arranged to illuminate a patterning device with a radiation beam diverging from an intermediate focus. The intermediate focus is located at a position substantially at the same level or below a bottom portion of the illumination system.

According to an aspect, there is provided an assembly that includes an illumination system and a source-collector module. The illumination system includes a housing, and an optical system located within the housing. The optical system includes at least one optical element. The optical system is constructed and arranged to illuminate a patterning device with a radiation beam diverging from an intermediate focus. The intermediate focus is located at a position substantially at the same level or below a bottom portion of the illumination system. The source-collector module includes a radiation source and a collector for imaging the radiation source in the intermediate focus.

According to an aspect, there is provided an illumination system that includes a housing, and an optical system located within the housing. The optical system includes at least one optical element. The optical system is constructed and arranged to illuminate a patterning device with a radiation beam diverging from an intermediate focus. The intermediate focus is located at a position substantially at the same level or below a bottom portion of the illumination system. The apparatus also includes a source-collector module that includes a radiation source and a collector for imaging the radiation source in the intermediate focus, and a support constructed to support the patterning device. The patterning device is constructed and arranged to impart the radiation beam with a pattern in its cross-section to form a patterned radiation beam. The apparatus also includes a substrate table constructed to hold a substrate, and a projection system configured to project the patterned radiation beam onto a target portion of the substrate.

According to another aspect, there is provided a method for manufacturing an illumination system. The method includes providing a housing with an optical system that includes at least one optical element for imaging an intermediate focus on a patterning device. The method also includes arranging the optical system to illuminate the patterning device using a radiation beam diverging from the intermediate focus. The intermediate focus is located at a position substantially at the same level or below a bottom portion of the illumination system.

More specifically, the location of the intermediate focus may be determined to be in an opening in a floor on which the illumination system is to be operational. Such an opening may be a through-hole, normally used for the transfer of air. A suitable location of the intermediate focus may be approximately halfway through the floor.

Such floors can have various thicknesses. Typically, such a floor may have a thickness of about 0.10 meter to about 2.00 meters. Thus the intermediate focus may be located at a position between about 0.10 meter and about 2.00 meters below the bottom portion of the illumination system. The floor may be partitioned in two layers: an upper layer and a lower layer. The upper layer may have a thickness of anywhere within the range of about 0.10 meter to 0.75 meter. The lower layer is often made of concrete and may have a thickness of anywhere between about 0.50 meter and 1.00 meter. However, other ranges and layer configurations may also occur.

Another variant of a floor on which the illumination system is to operate may have a relatively thin floor layer of approximately 0.20 meter thickness, the thin floor layer being supported a construction of pillars and horizontally oriented beams resting on the pillars, wherein the thin floor layer is supported by the beams. Thus, the intermediate focus may be located at a position of about 0.10 meter below the bottom portion of the illumination system. The pillars and the beams may typically be made of concrete.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
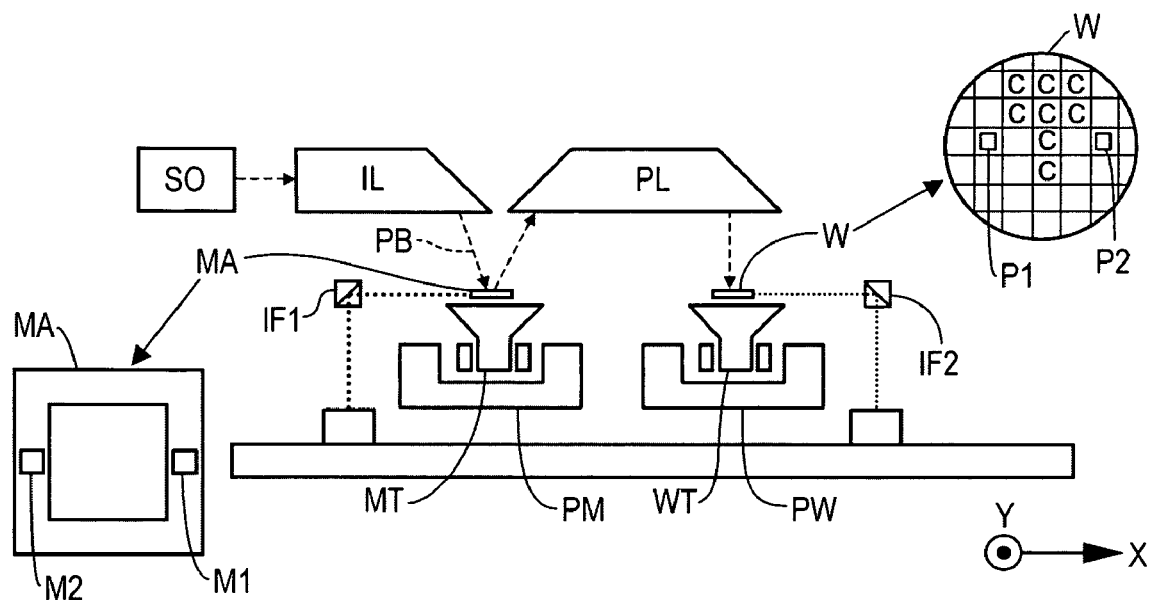
FIG. 1 depicts a lithographic apparatus according in which an embodiment of the invention can be applied.

FIG. 1 schematically depicts a lithographic apparatus in which an embodiment of the invention can be applied. The apparatus comprises: an illumination system (illuminator) IL configured to condition a radiation beam B (e.g. UV radiation or EUV radiation); a support construction (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support construction supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support construction can use mechanical, vacuum, electrostatic or other clamping techniques to hold the patterning device. The support construction may be a frame or a table, for example, which may be fixed or movable as required. The support construction may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system comprising one or more optical elements, for example, suitable directing mirrors and/or a beam expander. The source SO and the illuminator IL, together with the beam delivery system if needed, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask MA), which is held on the support construction (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
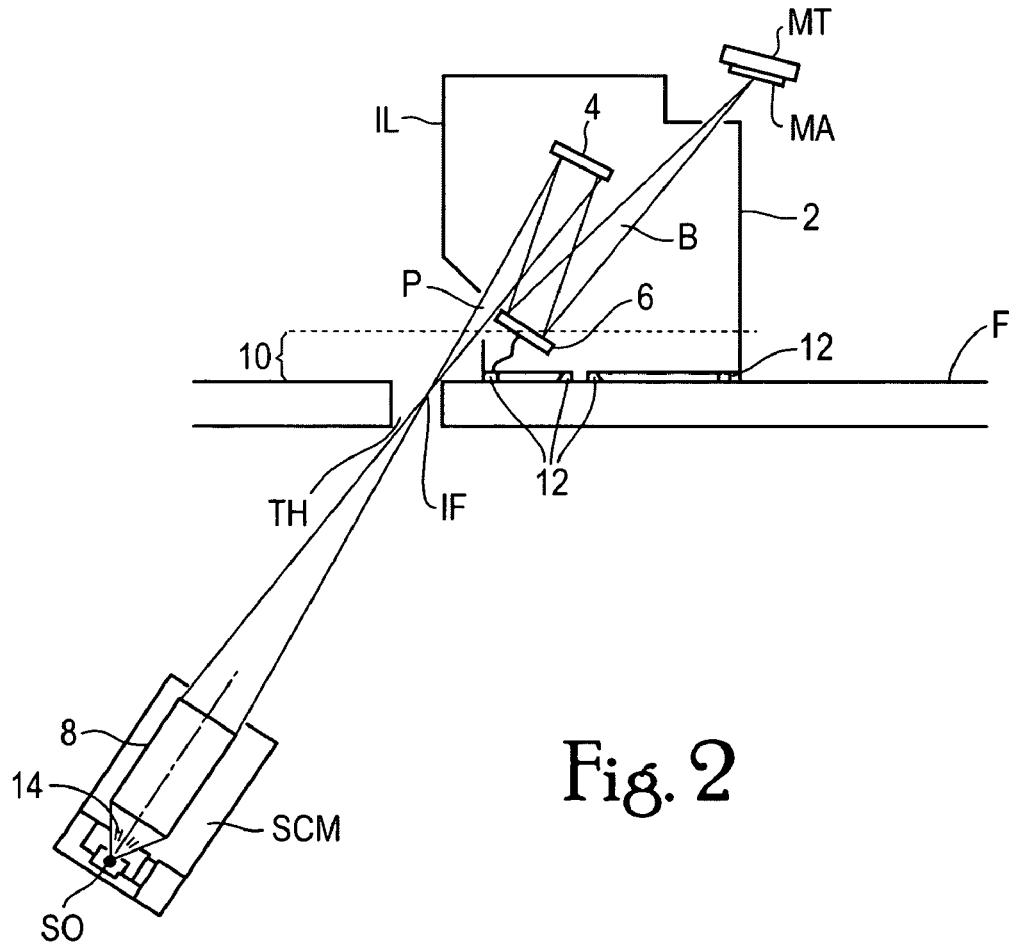
FIG. 2 depicts an embodiment of the illumination system according to the invention.

FIG. 2 shows an embodiment of the illumination system IL. The illumination system IL comprises a housing 2 comprising an optical system that comprises optical elements 4, 6. In this embodiment, the optical elements 4, 6 are a first mirror 4 and a second mirror 6. The first mirror 4 and the second mirror 6 are both located inside the housing 2 as can be seen in FIG. 2.

FIG. 2 also shows a source-collector module SCM comprising the radiation source SO and a collector 8. In this embodiment the collector 8 is located between the illumination system IL and the source SO. Alternatively, the source SO is located between the collector 8 and the illumination system IL. This alternative may be suitable when the collector is a normal incidence mirror (not shown in the Figures).

As can be seen in FIG. 2, a bottom portion 10 of this embodiment of the illumination system IL is provided with a plurality of support structures 12 for supporting the housing 2 of the illumination system IL. Such support structures 12 may be directly fixed to the housing 2. They may alternatively abut the housing 2 without being fixedly attached to the housing 2 or abut components which are fixed to the housing 2. In one embodiment, the support structures 12 create a free space under the housing of about 70 centimeters. The support structures 12 rest on a floor F which is typically provided with a through-hole TH which is normally used for the transfer of air. The source-collector module SCM further comprises a debris mitigator 14, for instance a foil trap, which is located between the source SO and the collector 8.

In operation, the source SO emanates a beam B of radiation, the beam B of radiation being focused by the collector 8 in an intermediate focus IF. In the embodiment of FIG. 2, the intermediate focus IF has been determined to be located at a position near the bottom portion 10 of the illumination system IL. The intermediate focus IF may be located at a position substantially at the same level or below the bottom portion 10 of the illumination system IL. In this embodiment, the position of the intermediate focus IF has been determined to be outside the housing 2 and in the through-hole TH about halfway in the floor F. The mirrors 4, 6 may be arranged to image the intermediate focus on the patterning device MA mounted on the support construction MT. The position of the intermediate focus IF may be located between about 0.10 meter and about 2.00 meters below the bottom portion 10 if the illumination system IL. In one embodiment, the position of the intermediate focus IF may be located between about 0.50 meter and about 1.50 meters below the bottom portion 10 of the illumination system IL. In one embodiment, the intermediate focus IF may be located between about 0.20 meter and about 0.80 meter below the bottom portion 10. In one embodiment, the intermediate focus IF may be located at a position of about 0.10 meter below the bottom portion 10 of the illumination system IL. For a fabricated floor having a thickness of about 1.00 meter, the intermediate focus IF may be located at a position of about 0.50 meter below the bottom portion 10, since a position of about 0.50 meter below the bottom portion 10 is about halfway through the fabricated floor. The support structures 12 may be arranged to have an adjustable height for adjusting the position at which the intermediate focus is located with respect to the bottom portion of the illumination system. Such illumination systems may be manufactured without having prior knowledge of the thickness of the floor on which it is to be used.

The first mirror 4 may directly reflect the radiation beam to the second mirror 6. The mirrors 4, 6 may be field facet mirrors. Field facet mirrors are known in the art and have been discussed, for instance in U.S. Pat. No. 6,195,201. The first mirror 4 comprises a plurality of mirror elements that are used to form a plurality of images near the corresponding mirror elements of the second mirror 6. The mirrors 4, 6 form an optical system which in use images the intermediate focus on the patterning device MA. Although two mirrors 4, 6 are shown in FIG. 2, the illumination system may have another number of optical elements. Such optical elements may be field facet mirrors or other elements.

Figure 3:
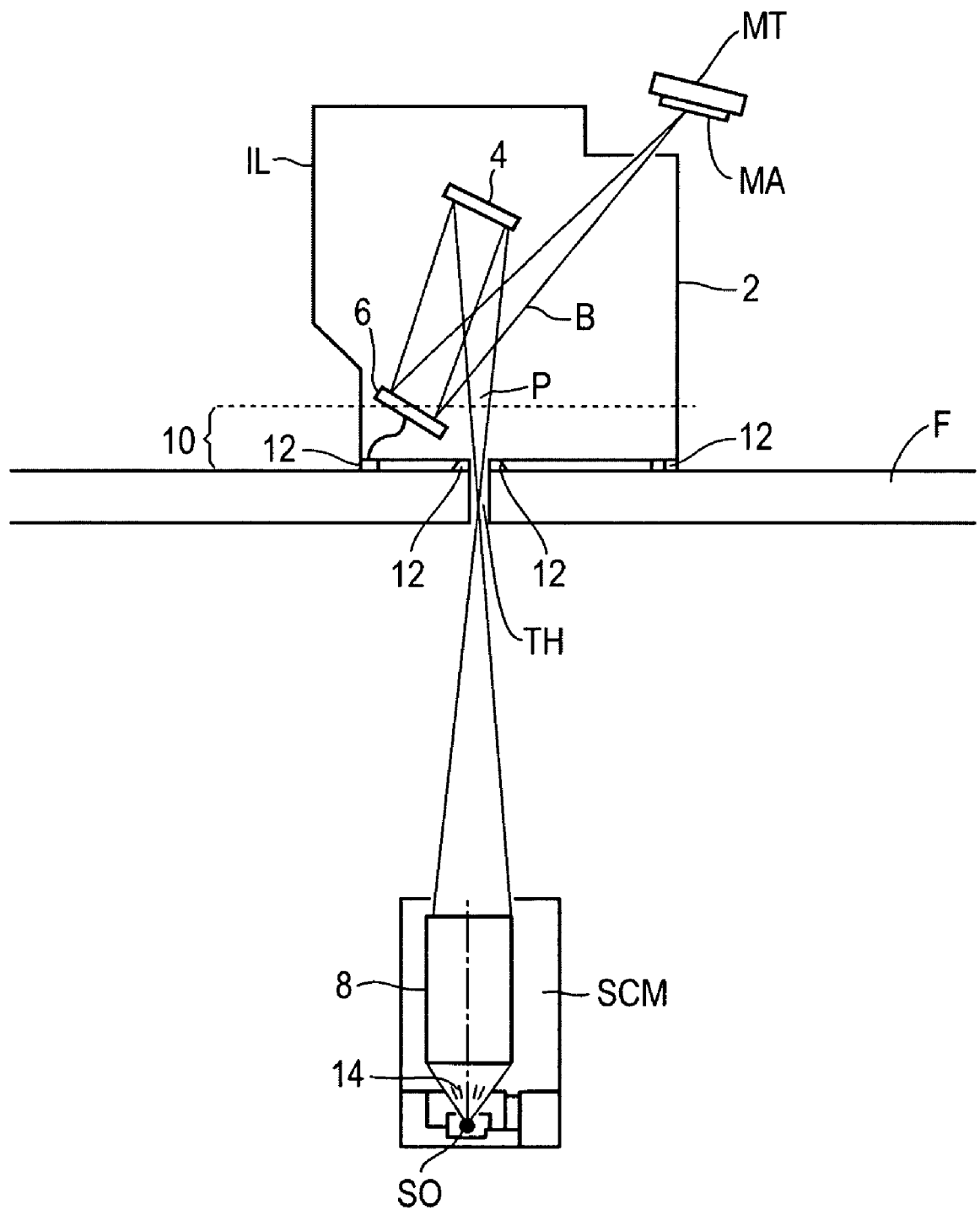
FIG. 3 depicts a further embodiment of the illumination system according to the invention.

A further embodiment of the illumination system is shown in FIG. 3. As can be seen in FIG. 3, part P of the radiation beam B between the collector 8 and the first mirror 4 propagates between the second mirror 6 and the support construction MT. This causes the possibility of the part P of the radiation beam B to propagate in a direction substantially perpendicular to the floor F thereby limiting the dimensions of a cross-section of the floor F and maximizing the cross-section of the beam which can be transmitted through the floor F.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An illumination system comprising:
    a housing; and
    an optical system located within the housing, the optical system comprising at least one optical element, the optical system being constructed and arranged to receive a radiation beam as the radiation beam is diverging from an intermediate focus and to illuminate a patterning device with the radiation beam, the intermediate focus being located at a position below a bottom portion of the illumination system.

2. An illumination system according to claim 1; wherein the optical system is arranged to image the intermediate focus on the patterning device.

3. An illumination system according to claim 1, wherein the bottom portion of the illumination system is provided with one or more support structures for supporting the housing.

4. An illumination system according to claim 3, wherein at least one of the support structures has an adjustable height to adjust the position at which the intermediate focus is located with respect to the bottom portion of the illumination system.

5. An illumination system according to claim 1, wherein the intermediate focus is located at a position between about 0.10 meter and about 2.00 meters below the bottom portion of the illumination system.

6. An illumination system according to claim 5, wherein the intermediate focus is located at a position between about 0.20 meter and 1.50 meters below the bottom portion of the illumination system.

7. An illumination system according to claim 5, wherein the intermediate focus is located at a position of about 0.10 meter below the bottom portion of the illumination system.

8. An illumination system according to claim 1, further comprising a mirror on which a radiation beam that is emanated from the intermediate focus is directly incident.

9. An illumination system according to claim 8, further comprising a further minor constructed and arranged to focus the radiation beam on the patterning device, wherein the minor is arranged to reflect the radiation beam directly to the further mirror.

10. An illumination system according to claim 1, further comprising a minor constructed and arranged to focus the radiation beam on the patterning device.

11. An illumination system according to claim 1, wherein the intermediate focus has a position located outside the housing.

12. An assembly comprising:
    an illumination system comprising
        a housing, and
        an optical system located within the housing, the optical system comprising at least one optical element, the optical system being constructed and arranged to receive a radiation beam as the radiation beam is diverging from an intermediate focus and to illuminate a patterning device with the radiation beam, the intermediate focus being located at a position below a bottom portion of the illumination system; and
    a source-collector module comprising a radiation source and a collector for imaging the radiation source in the intermediate focus.

13. An assembly according to claim 12, wherein the radiation source is located at a position below the bottom portion of the illumination system.

14. A lithographic apparatus comprising:
    an illumination system comprising
        a housing, and
        an optical system located within the housing, the optical system comprising at least one optical element, the optical system being constructed and arranged to receive a radiation beam as the radiation beam is diverging from an intermediate focus and to illuminate a patterning device with the radiation beam, the intermediate focus being located at a position below a bottom portion of the illumination system;
    a source-collector module comprising a radiation source and a collector for imaging the radiation source in the intermediate focus;
    a support constructed to support the patterning device, the patterning device being constructed and arranged to impart the radiation beam with a pattern in its cross-section to form a patterned radiation beam;
    a substrate table constructed to hold a substrate; and a projection system configured to project the patterned radiation beam onto a target portion of the substrate.

15. A method for manufacturing an illumination system, the method comprising:

providing a housing with an optical system comprising at least one optical element for imaging an intermediate focus on a patterning device; and arranging the optical system to receive a radiation beam as the radiation beam is diverging from an intermediate focus and to illuminate the patterning device using the radiation beam, the intermediate focus being located at a position below a bottom portion of the illumination system.

16. A method according to claim 15, wherein the optical system is arranged to image the intermediate focus on the patterning device.

17. A method according to claim 15, wherein the location of the intermediate focus is determined to be in an opening in a floor on which the assembly is to be operational.

18. A method according to claim 17, wherein the location of the intermediate focus is approximately halfway through the floor.

19. A method according to claim 15, wherein the intermediate focus is determined to be at a position between about 0.10 meter and about 2.00 meters below the bottom portion of the illumination system.

20. A method according to claim 19, wherein the intermediate focus is located at a position between about 0.50 meter and about 1.50 meters below the bottom portion of the illumination system.

21. A method according to claim 19, wherein the intermediate focus is determined to be located at a position of about 0.10 meter below the bottom portion of the illumination system.

22. A method according to claim 15, further comprising providing a source-collector module comprising a radiation source and a collector, the source-collector module being arranged to image the radiation source in the intermediate focus.

23. A method according to claim 22, further comprising placing the radiation source at a position below the bottom portion of the illumination system.

24. A method according to claim 15, wherein the intermediate focus is determined to be located outside the housing.

\* \* \* \* \*